United States Patent
Loechelt et al.

(10) Patent No.: US 7,821,063 B2
(45) Date of Patent: Oct. 26, 2010

(54) SEMICONDUCTOR DEVICE HAVING ENHANCED PERFORMANCE AND METHOD

(75) Inventors: Gary H. Loechelt, Tempe, AZ (US);
Robert B. Davies, Tempe, AZ (US);
David H. Lutz, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 233 days.

(21) Appl. No.: 12/131,295

(22) Filed: Jun. 2, 2008

(65) Prior Publication Data
US 2008/0265313 A1 Oct. 30, 2008

Related U.S. Application Data

(62) Division of application No. 11/095,136, filed on Apr. 1, 2005, now Pat. No. 7,397,084.

(51) Int. Cl.
*H01L 29/76* (2006.01)

(52) U.S. Cl. ............... 257/341; 257/339; 257/342; 257/E29.148

(58) Field of Classification Search .......... 257/339, 257/341, 342, 370, 378, 640, 641, 649, 650
See application file for complete search history.

(56) References Cited

U.S. PATENT DOCUMENTS

| | | | | |
|---|---|---|---|---|
| 4,571,606 | A * | 2/1986 | Benjamin et al. | 257/339 |
| 5,304,831 | A * | 4/1994 | Yilmaz et al. | 257/341 |
| 6,627,961 | B1 * | 9/2003 | Francis et al. | 257/378 |

* cited by examiner

*Primary Examiner*—Wai-Sing Louie
(74) *Attorney, Agent, or Firm*—Kevin B. Jackson

(57) ABSTRACT

In one embodiment, a semiconductor device is formed in a body of semiconductor material. The semiconductor device includes a localized region of doping near a portion of a channel region where current exits during operation.

20 Claims, 7 Drawing Sheets

SEMICONDUCTOR DEVICE HAVING ENHANCED PERFORMANCE AND METHOD

The present application is a divisional application of U.S. application Ser. No. 11/095,136 filed on Apr. 1, 2005, which issued as U.S. Pat. No. 7,397,084 on Jul. 8, 2008, and priority thereto is hereby claimed.

FIELD OF THE INVENTION

This invention relates generally to semiconductor devices, and more specifically to power switching devices including high speed devices such as RF power amplifiers and methods of their manufacture.

BACKGROUND OF THE INVENTION

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of MOSFET devices, designers often are faced with trade-offs in device parameter performance. Specifically, available device structure or fabrication process choices may improve one device parameter, but at the same time such choices may degrade one or more other device parameters. For example, available structures and processes that improve the output or drive current ($I_{DS}$) capability and on resistance of a MOSFET device also degrade its breakdown voltage ($BV_{DSS}$) capability and increase gate to drain capacitance.

Accordingly, improved semiconductor device structures and methods of their manufacture are needed to address the above mentioned issues as well as others.

DETAILED DESCRIPTION OF THE DRAWINGS

Figure 1:
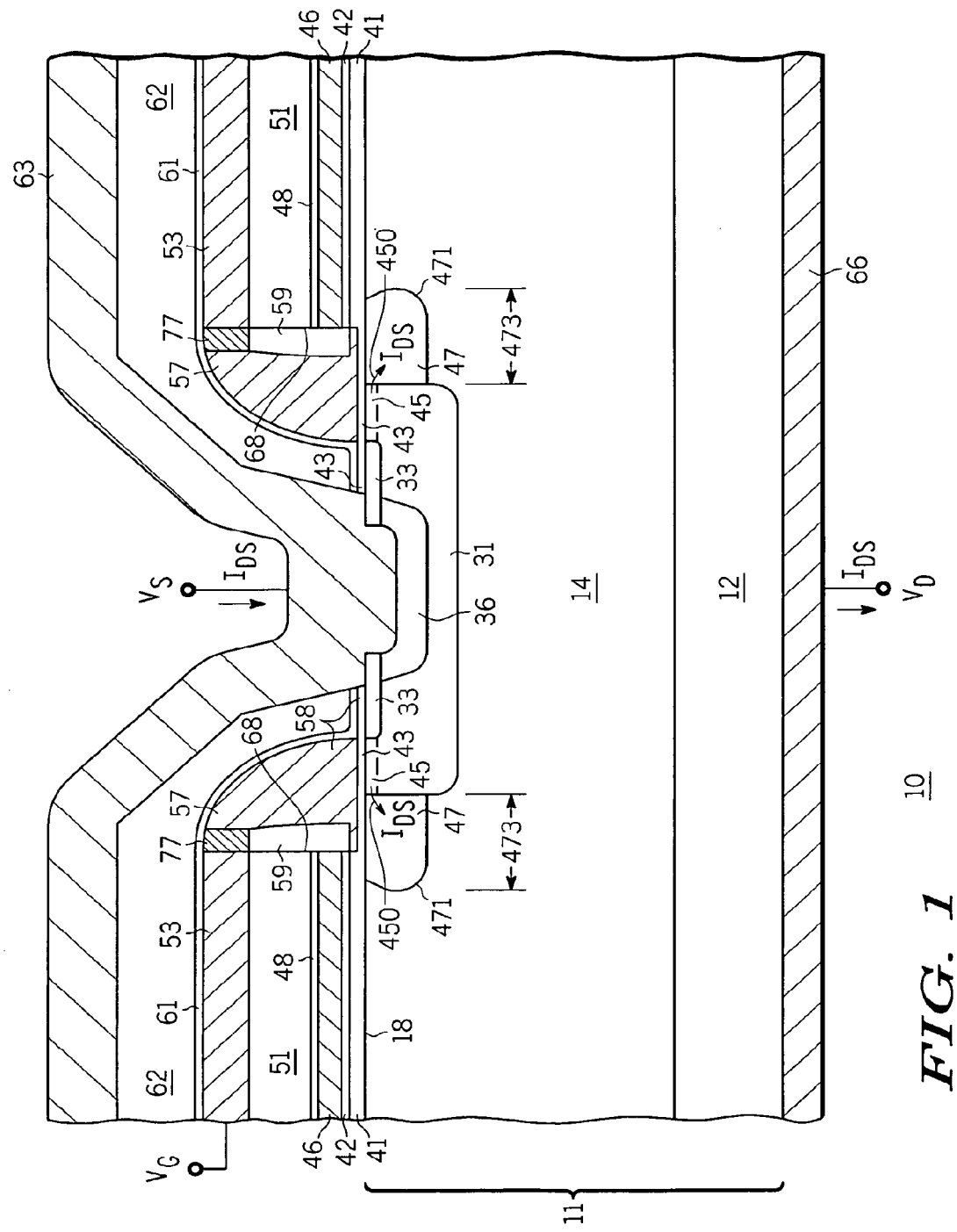
FIG. 1 illustrates a highly enlarged partial cross-sectional view of a semiconductor structure in accordance with an embodiment of the present invention.

For ease of understanding, elements in the drawing figures are not necessarily drawn to scale, and like element numbers are used where appropriate throughout the various figures. While the discussion below describes an n-channel device, the invention also pertains to p-channel devices, which may be formed by reversing the conductivity type of the described layers and regions.

In addition, the device of the present invention may embody either a cellular design (where the body regions are a plurality of cellular regions) or a single body design (where the body region is comprised of a single region formed in an elongated pattern, typically in a serpentine pattern). However, the device of the present invention will be described as a cellular design throughout the description for ease of understanding. It should be understood that it is intended that the present invention encompass both a cellular design and a single base design.

FIG. 1 shows an enlarged partial cross-sectional view of an insulated gate field effect transistor (IGFET), MOSFET, power transistor, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in range of approximately 0.001 to about 0.005 ohm-cm, and may be doped with arsenic. In the embodiment shown, substrate 12 provides a drain contact. A semiconductor layer or extended drain region 14 is formed in or on substrate 12. In one embodiment, semiconductor layer 14 is formed using conventional epitaxial growth techniques. Alternatively, extended drain region 14 is formed using conventional doping and diffusion techniques. In an embodiment suitable for a 50 volt device, layer 14 is n-type with a dopant concentration of about $1.0 \times 10^{15}$ atoms/cm$^3$, and has a thickness on the order of about 3 to about 5 microns. The thickness and dopant concentration of layer 14 is increased or decreased depending on the desired $BV_{DSS}$ rating of device 10. It is understood that other materials may be used for body of semiconductor material 11 or portions thereof including silicon-germanium, silicon-germanium-carbon, carbon doped silicon, silicon carbide, or the like.

A body or doped region 31 is formed in semiconductor layer 14 and extends from a major surface 18 of body of semiconductor material 11. By way of example, body region 31 comprises p-type conductivity, and has a dopant concentration suitable for forming an inversion layer that operates as conduction channels 45 of device 10. Body region 31 extends from major surface 18 to a depth, for example, of about 0.5 to about 3.0 microns. An n-type source, current carrying, or input region 33 is formed within or in body region 31 and extends from major surface 18 to a depth, for example, of about 0.1 microns to about 0.5 microns. A p-type body contact or contact region 36 is also formed in body region 31, and provides a lower contact resistance to body region 31 at major surface 18. In addition, contact region 36 lowers the sheet resistance of body region 31 under source region 33, which suppresses parasitic bipolar effects.

A first dielectric layer 41 is formed over or adjoining portions of major surface 18. For example, dielectric layer 41 comprises a thermal oxide layer having a thickness of about 0.05 microns to about 0.2 microns. A second dielectric layer 42 is formed over dielectric layer 41. In one embodiment, second dielectric layer 42 comprises silicon nitride, and has a thickness of about 0.05 microns.

Gate dielectric layers 43 are formed over or adjoining other portions of major surface 18 adjacent to body region 31. Gate dielectric layers 43 comprise for example, silicon oxide, and have a thickness of about 0.01 microns to about 0.1 microns. In alternative embodiments, gate dielectric layers 43 comprise silicon nitride, tantalum pentoxide, titanium dioxide, barium strontium titanate, or combinations thereof including combinations with silicon oxide, or the like.

In an optional embodiment, a doped polycrystalline semiconductor layer, conductive layer, shield layer, or ground plane layer 46 is formed over dielectric layers 41 and 42. For example, conductive layer 46 comprises a doped polycrystalline silicon layer or polysilicon layer and has a thickness of about 0.1 microns. Although not shown, conductive layer 46 may be tied or coupled directly or indirectly to a conductive contact or source contact layer 63.

A third dielectric layer 48 is formed over conductive layer 46, and a fourth dielectric layer 51 is formed over third dielectric layer 48. By way of example, dielectric layer 48 comprises silicon nitride (e.g., about 0.05 microns in thickness), and dielectric layer 51 comprises a deposited silicon oxide (e.g., about 0.7 microns in thickness). A conductive layer 53 is formed over dielectric layer 51, and comprises for example, n-type polycrystalline silicon or polysilicon (e.g., about 0.3 microns in thickness).

Conductive spacer gate regions, vertical spacer gate regions, or spacer defined gate regions or conductive electrodes 57 are formed over gate dielectric layers 43, and are isolated from conductive layers 46 by dielectric spacers 59. Conductive spacer gate regions 57 together with gate dielectric layers 43 form a control electrode or gate structure 58. Conductive spacer gate regions 57 comprise, for example, n-type polycrystalline silicon or polysilicon, and are about 0.2 to about 0.8 microns in thickness. In an exemplary embodiment, dielectric spacers 59 comprise silicon nitride, and are about 0.1 microns in thickness. Spacer gate regions 57 are coupled to conductive layer 53 to provide a conductive gate structure, which controls the formation of channels 45 and the conduction of current in device 10. In the embodiment shown, a conductive connective portion 77 couples spacer gate regions 57 to conductive layers 53. Conductive connective portions 77 comprise for example, n-type polysilicon. A spacer defined gate region refers to a control electrode formed with gate material deposited on one surface to control a channel formed on another perpendicular surface. In the case of device 10, channels 45 are formed at major surface 18, which is considered a horizontal surface. The control electrode film used to form spacer gate regions 57 is deposited along vertical surfaces 68, which are perpendicular to surface 18.

Conductive spacer gate regions 57 provide a minimal gate to drain overlap compared to conventional devices, thereby significantly reducing gate charge. Additionally, in device 10 the electrical routing for the gate is provided by conductive layer 53, which is elevated above major surface 18 thereby further reducing gate charge. Further, conductive layer 46 functions, among other things, as a ground plane or shield layer interposed between the gate and drain regions to further reduce gate to drain capacitance. These features provide enhanced switching speed and reduced input charge requirements.

A fifth dielectric layer 61 is formed over portions of device 10, and comprises for example, silicon nitride having thickness of about 0.05 microns. An interlayer dielectric (ILD) layer 62 is formed over portions of device 10, and comprises for example, a deposited silicon oxide having a thickness of about 0.8 microns. An opening is formed in the dielectric layers to provide a contact to device 10 for source contact layer 63. As shown, a portion of major surface 18 is etched so that source contact layer 63 makes contact to both source regions 33 and body region 36. In one embodiment, source contact layer 63 comprises an aluminum silicon alloy or the like. A drain contact layer or conduction electrode 66 is formed on an opposing surface of region of semiconductor material 11, and comprises, for example, a solderable metal structure such a titanium-nickel-silver, chrome-nickel-gold, or the like.

In accordance with the present invention, device 10 further includes doped regions, current spreading regions, doped veil regions, or localized regions of dopant 47, which are formed in portions of semiconductor layer 14 adjacent to, in proximity to, or in the immediate vicinity of body region 31 and adjacent to or in proximity to major surface 18. Specifically, doped regions 47 are placed or positioned in semiconductor layer 14 where current $I_{DS}$ exits channels 45 (i.e., the drain edge of the channel) into extended drain region 14 when device 10 is in operation. In one embodiment, doped regions 47 are confined both vertically and horizontally near major surface 18 at outer edges 450 of channels 45. Doped regions 47 extend a distance 473 from body region 31 on the order of about 0.1 to 0.4 microns with the doping concentration beyond or outside of doped regions 47 and in proximity to major surface 18 being equal to or approaching the background doping concentration of semiconductor layer 14.

Doped regions 47 comprise the same conductivity type as semiconductor layer 14, and have a doping concentration approximately five times to approximately fifty times the doping concentration of semiconductor layer 14. In one embodiment, doped regions 47 have a doping concentration approximately twenty to forty times the doping concentration of semiconductor layer 14. By way of example for a 50 volt device, doped regions 47 comprise a doping concentration of about $1.0 \times 10^{15}$ atoms/cm$^3$ at an outer edge 471, and a dopant concentration of about $2.0 \times 10^{16}$ atoms/cm$^3$ at edges 450 of channel regions 45. The inventors of the present invention found that localized regions of doping 47 provide enhanced performance compared to a device using for example, a blanket or more continuous layer of increased doping near major surface 18. For example, a higher $I_{DS}$ and lower on-resistance is achieved for a given breakdown voltage $BV_{DSS}$. By using the localized regions in accordance with the present invention, a higher $BV_{DSS}$ is achieved compared to those devices using a blanket region thereby providing a device with enhanced blocking voltage performance. Also, device 10 has lower gate to drain and shield to drain capacitances compared devices using a blanket or continuous layer thereby providing device 10 with enhanced switching performance.

Figure 2:
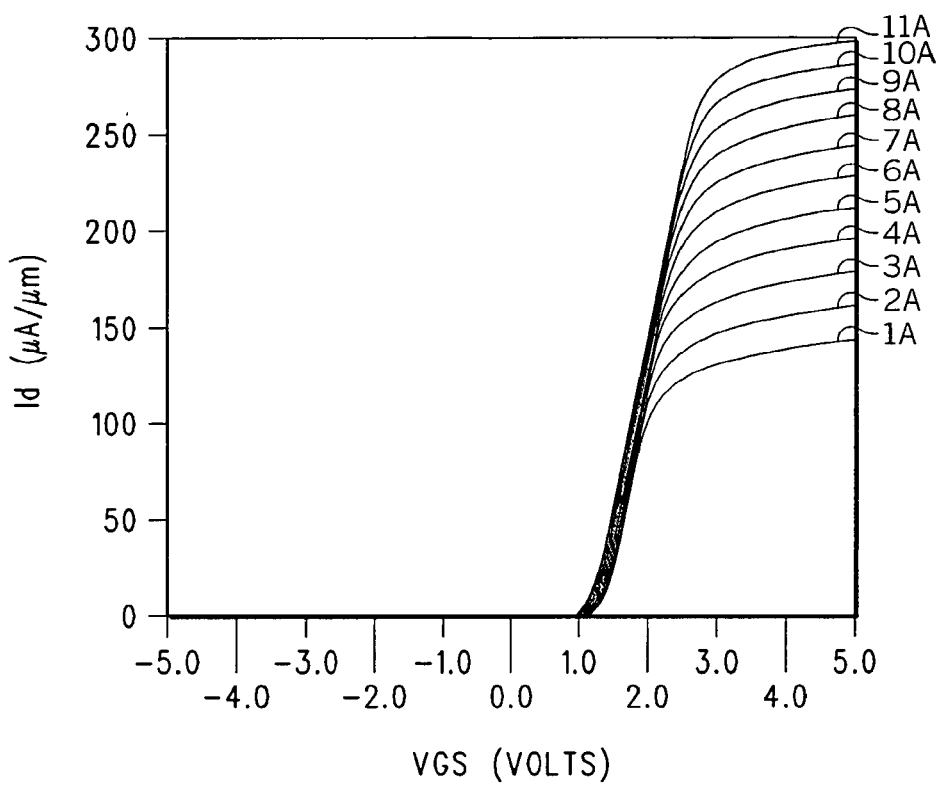
FIG. 2 is graph showing $I_{DS}$ as a function of $V_{GS}$ for various embodiments of the present invention.

FIG. 2 is a graph showing drain current $I_{DS}$ performance for device 10 as a function of $V_{GS}$ under a bias $V_{DS}$ of 28 volts. The graph further depicts $I_{DS}$ as a function of various peak doping concentrations in doped regions 47, where line 1A corresponds to no doped regions 47, line 2A corresponds to a peak doping concentration of $1.0 \times 10^{16}$ atoms/cm$^3$, line 3A corresponds to a peak doping concentration of $2.0 \times 10^{16}$ atoms/cm$^3$, line 4A corresponds to a peak doping concentration of $3.0 \times 10^{16}$ atoms/cm$^3$, line 5A corresponds to a peak doping concentration of $4.0 \times 10^{16}$ atoms/cm$^3$, line 6A corresponds to a peak doping concentration of $5.0 \times 10^{16}$ atoms/cm$^3$, line 7A corresponds to a peak doping concentration of $6.0 \times 10^{16}$ atoms/cm$^3$, line 8A corresponds to a peak doping concentration of $7.0 \times 10^{16}$ atoms/cm$^3$, line 9A corresponds to a peak doping concentration of $8.0 \times 10^{16}$ atoms/cm$^3$, line 10A corresponds to a peak doping concentration of $9.0 \times 10^{16}$ atoms/cm$^3$, and line 11A corresponds to a peak doping concentration of $1.0 \times 10^{17}$ atoms/cm$^3$. As shown in FIG. 2, localized doped regions 47 significantly improve $I_{DS}$ performance with increasing peak doping concentration.

Figure 3:
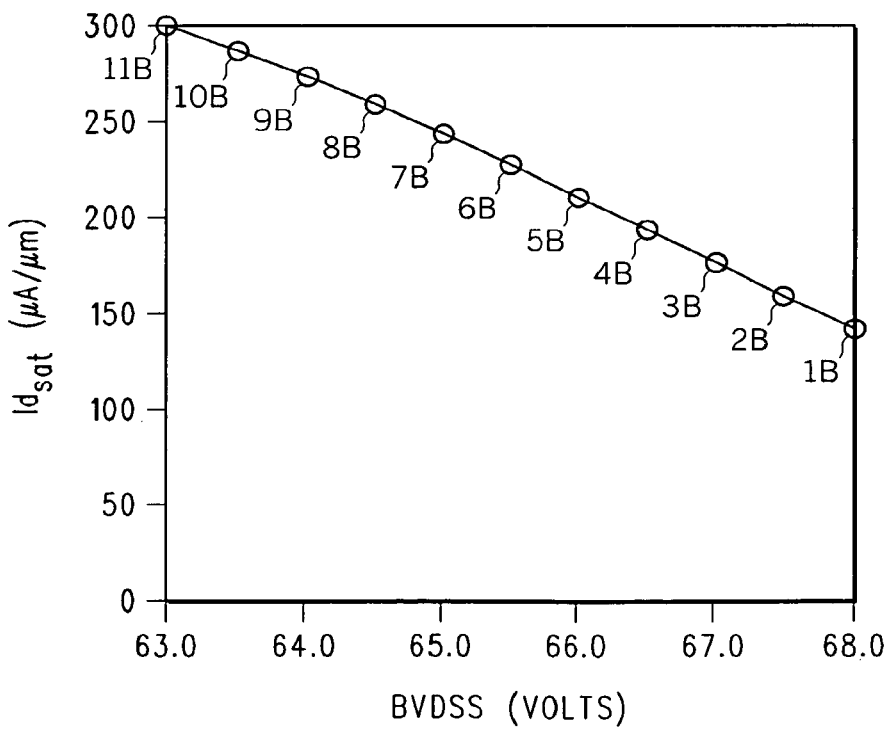
FIG. 3 is graph showing $I_{DSAT}$ and $BV_{DSS}$ performance for various embodiments of the present invention.

FIG. 3 is a graph showing saturation current $I_{DSAT}$ as a function of breakdown voltage $BV_{DSS}$. Lines 1B through 11B correspond to the same peak doping concentrations 1A through 11A as described above for FIG. 2. As shown in FIG. 3, device 10 in accordance with the present invention exhibits only a slight decrease in $BV_{DSS}$ while achieving a significant increase in $I_{DSAT}$ performance.

Figure 4:
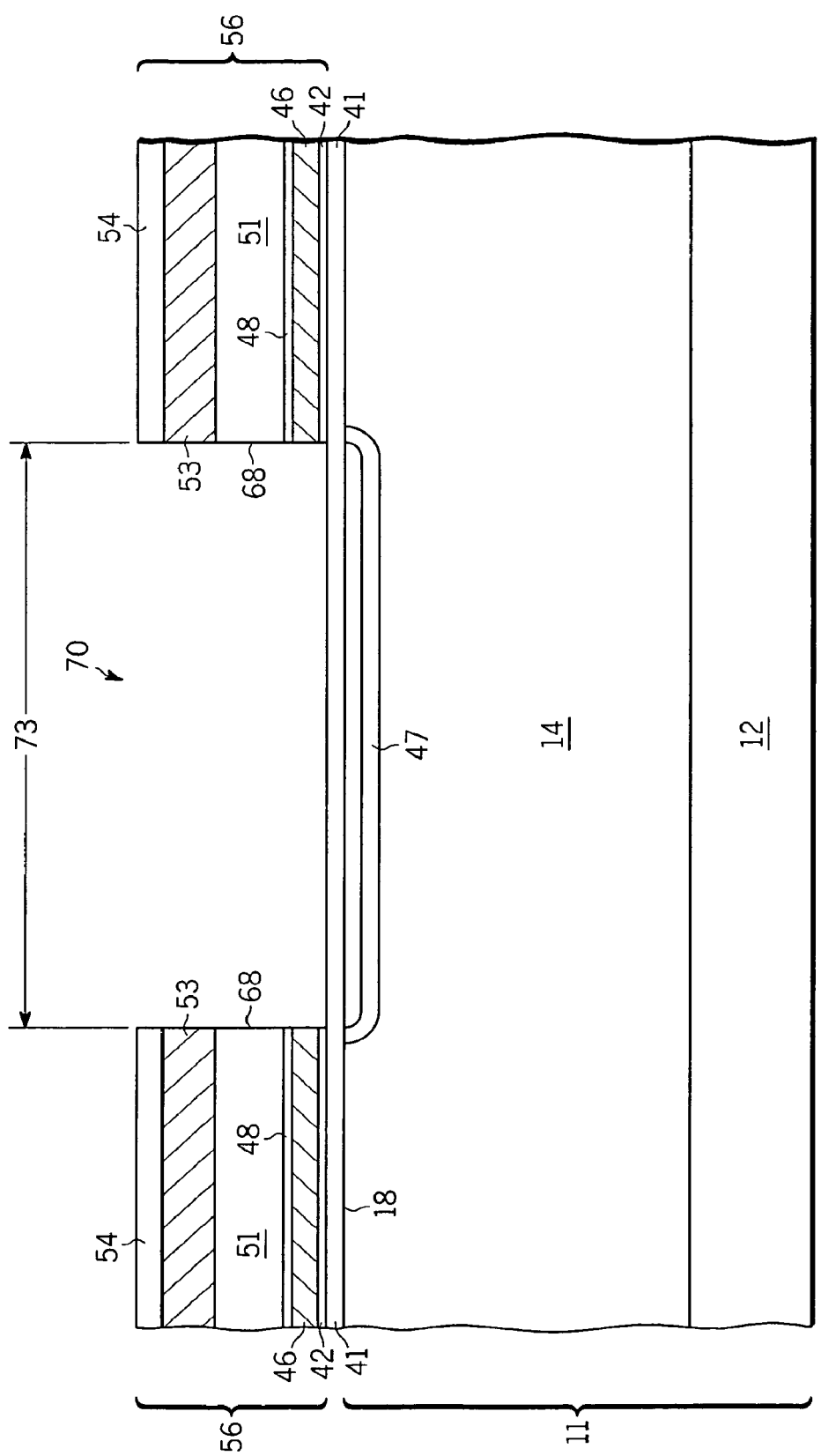
FIG. 4 illustrates a highly enlarged partial cross-sectional view of an embodiment of the present invention at an early stage of fabrication.

Turning now to FIGS. 4-7, a process for forming device 10 in accordance with the present invention is described. FIG. 4 shows an enlarged partial cross-sectional view of device 10 at an early stage of fabrication. First dielectric layer 41 is formed over major surface 18, and comprises for example, a silicon oxide about 0.05 microns to about 0.2 microns thick. A thermal oxide grown at about 900 degrees Celsius is suitable. Next, second dielectric layer 42 is formed over dielectric 41, and comprises, for example, about 0.1 microns of silicon nitride.

Conductive layer 46 is then formed over second dielectric layer 42. In one embodiment, conductive layer 46 comprises about 0.1 microns of polysilicon, and is either deposited doped or undoped. If conductive layer 46 is deposited initially undoped, conductive layer 46 is subsequently doped using, for example, ion implantation techniques. In one embodiment, conductive layer 46 is p-type and doped with boron. A boron ion implant dose of about $5.0 \times 10^{15}$ to about $1.0 \times 10^{16}$ atoms/cm$^2$ with an implant energy of about 30 KeV is sufficient for doping conductive layer 46.

Next, third dielectric layer 48 is formed over conductive layer 46, and fourth dielectric layer 51 is formed over third dielectric layer 48. Third dielectric layer 48 comprises, for example, silicon nitride (e.g., about 0.05 microns in thickness), and dielectric layer 51 comprises a deposited oxide (e.g., about 0.7 microns in thickness). Conductive layer 53 is then formed over fourth dielectric layer 51, and comprises for example, n-type polysilicon (e.g., about 0.3 microns in thickness). A protective layer 54 is formed over conductive layer 53, and comprises for example, about 0.15 microns of silicon nitride.

A photolithographic and etch step is done to etch through portions of layers 54, 53, 51, 48, 46 and 42 to provide an opening 70. This also forms pedestal stack structures 56, which are comprised of remaining portions of layers 42, 46, 48, 51, 53 and 54. In one embodiment, opening 70 has a width 73 on the order of about 5.0 microns to about 8.0 microns.

In one embodiment for forming doped regions 47, n-type dopant is introduced or implanted into semiconductor layer 14 through opening 70. In this embodiment, the edges of doped regions 47 are defined by side surfaces 68 of pedestal structures 56 (i.e., doped regions 47 are self aligned to pedestal structures 56). By way of example, doped regions 47 are formed by implanting phosphorous at dose of about $5.0 \times 10^{11}$ atoms/cm$^2$ to about $2.0 \times 10^{12}$ atoms/cm$^2$, an implant energy of about 250 KeV, and at an angle in the range from about 25 degrees to about 60 degrees in quadrature. In one embodiment, the angle is about 45 degrees. The amount of tilt is adjusted based on width 73 of opening 70 and the height of pedestal stack structures 56. The energy of the implant is selected such that the wafer surface is not doped in opening 70 but produces a subsurface layer approximately 0.5 microns underlying opening 70. Thus, the channel region of the device at the surface in opening 70 is not counter-doped when doped region 31 is formed thereby increasing the mobility in the channel. Furthermore, the angle implant creates a region of dopant at the edge of the channel approximately 0.5 microns beyond side surfaces 68. The angle implant impinges on side surfaces 68 penetrating layers 41, 42, 46, 48 forming doped region 47. The doped region extends from the surface to approximately a depth 0.5 microns below the surface. The portion of the ion implant that is implanted subsurface underlying opening 70 is counter-doped by a much heavier channel implant or doping process, when doped region 31 is formed as described below. The implanted dopant is then activated and diffused at this point, or at a later step, for example after doped region 31 is formed. Activating the dopant at this point diffuses the dopant further under pedestal stacks 56, which increases distance 473 (shown in FIG. 1) as desired.

In an alternative embodiment for forming doped regions 47, a conventional implant angle of seven degrees is used, and the implanted dopant is then activated and diffused to move the dopant laterally underneath pedestal structures 56 to provide a similar structure. Alternatively, the dopant is activated at a later step. In a further embodiment, a conventional masking step is used to form doped regions 47 prior to forming pedestal structures 56 in a non-self aligned manner. Pedestal structures 56 are then formed over major surface 18 to provide a desired location of doped regions 47.

Figure 5:
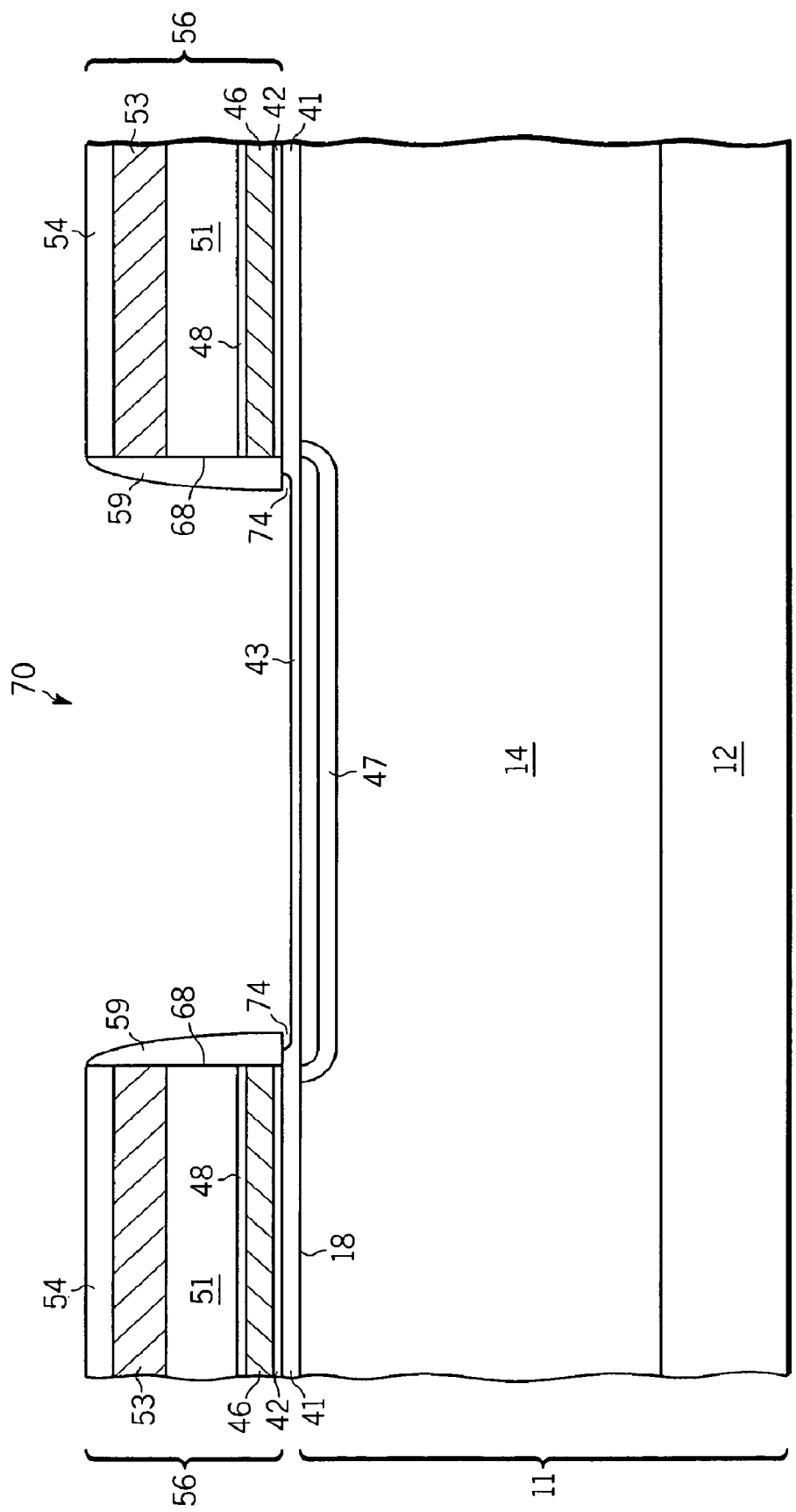
FIG. 5 illustrates a highly enlarged partial cross-sectional view of an embodiment of the present invention at a later stage of fabrication.

FIG. 5 shows an enlarged partial cross-sectional view of device 10 after additional processing steps that form dielectric spacers 59. In one embodiment, a silicon nitride film is deposited over pedestal stack structures 56 and first dielectric layer 41. By way of example, a silicon nitride film about 0.1 microns thick is deposited using chemical vapor deposition techniques. Next, a conventional anisotropic etch back step is used to remove portions of the silicon nitride layer over pedestal stack structures 56 and first dielectric layer 41 while leaving portions of the silicon nitride layer on sidewalls or vertical surfaces 68 to form dielectric spacers 59. In an alternative embodiment, doped regions 47 are formed at this stage of fabrication using the angled implant conditions set forth above. In one embodiment, the implanted dopant is then activated diffused at the stage as well to provide lateral diffusion under pedestal stacks 56.

In a further step, a silicon oxide wet etch is then used to remove portions of dielectric layer 41 within opening 70. By way of example, a diluted hydrofluoric acid (e.g., 50:1) is used to etch dielectric layer 41. In an exemplary embodiment, the etch time is prolonged (e.g., 8 to 15 minutes) in order to undercut or remove material from dielectric layer 41 from beneath dielectric spacers 59 to form recessed portions 74. Recessing dielectric layer 41 in this manner ensures that channels 45 (shown in FIG. 1) formed in body region 31 extend into semiconductor layer 14 to allow channel current to flow more efficiently. In an exemplary embodiment, portions 74 are recessed under dielectric spacers 59 a distance of less than about 0.1 microns. A thermal silicon oxide is then grown on major surface 18 within opening 70 to thickness of about 0.0125 microns to form gate dielectric layer 43.

Figure 6:
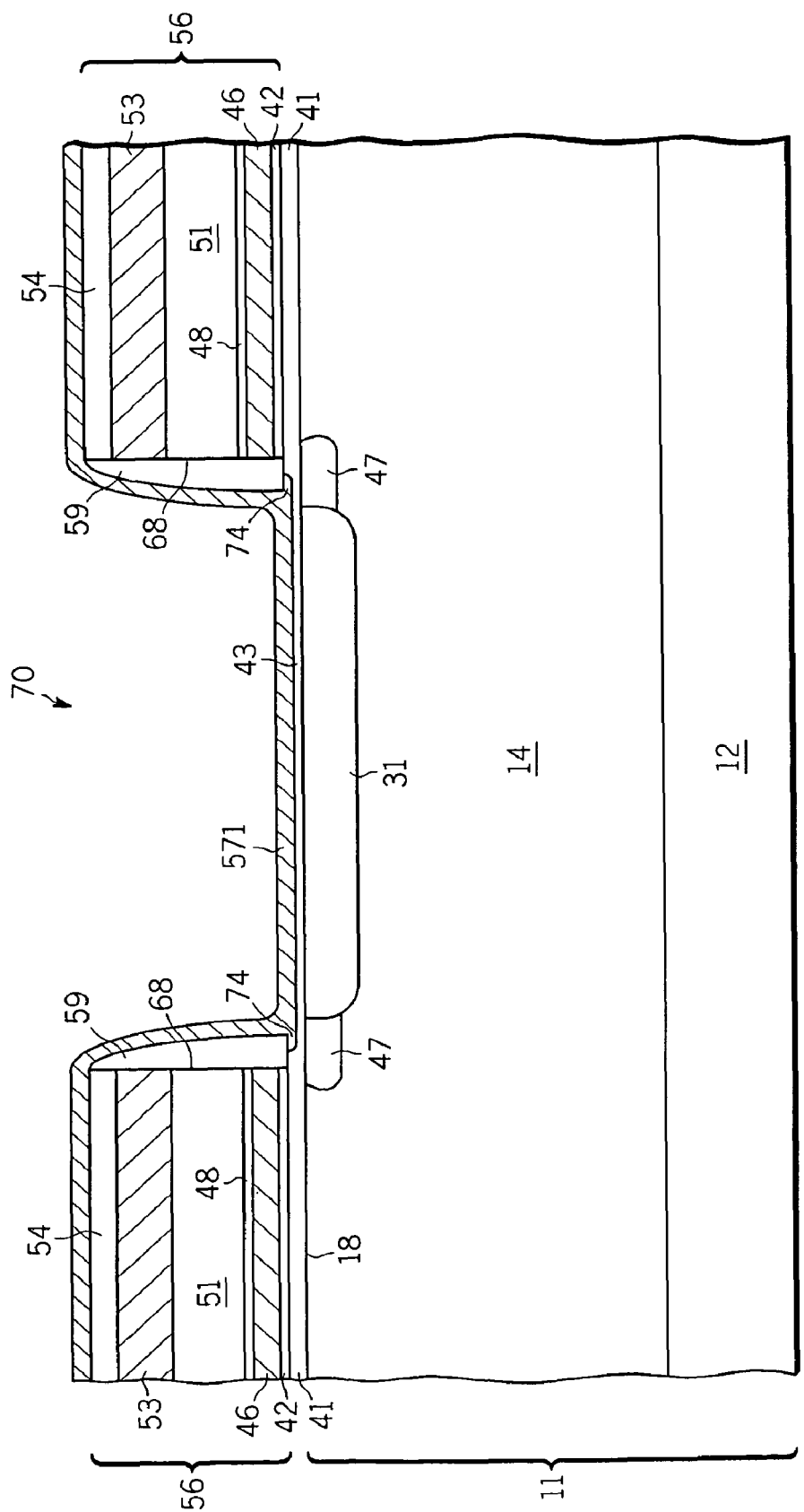
FIG. 6 illustrates a highly enlarged partial cross-sectional view of an embodiment of the present invention at a still later stage of fabrication.

FIG. 6 shows an enlarged partial cross-sectional view of device 10 after additional processing. A conformal layer of semiconductor material 571 is deposited over device 10 to a thickness of about 0.1 microns to about 0.15 microns. Boron dopant is then introduced through opening 70 and conformal layer of semiconductor material 571 into major surface 18 to provide p-type dopant for body region 31. By way of example, conformal layer of semiconductor material 571 comprises undoped polysilicon, and the boron is implanted through the undoped polysilicon into semiconductor layer 14. Region 31 is doped by a minimum of two ion implants each having a dose of about $1.0\times10^{13}$ atoms/cm$^2$ and the two implants respectively having an energy of about 45 KeV and 100 KeV is suitable for a 50 volt device.

Figure 7:
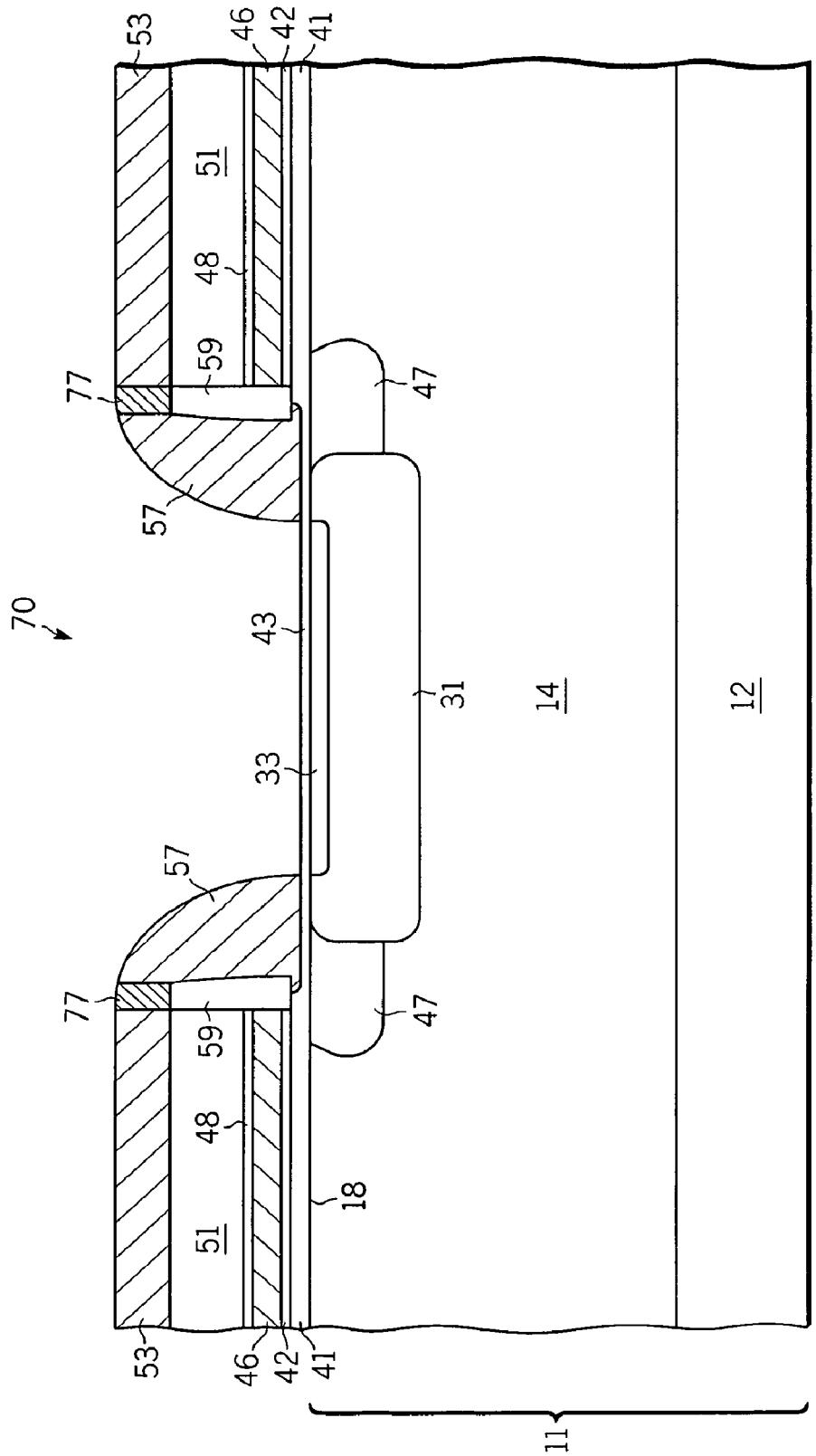
FIG. 7 illustrates a highly enlarged partial cross-sectional view of an embodiment of the present invention at a further stage of fabrication.

FIG. 7 shows an enlarged partial cross-sectional view of device 10 after further processing. A second conformal layer of semiconductor material is then deposited over conformal layer of semiconductor material 571 and both layers are etched to provide spacer gates 57. By way of example, the second conformal layer of semiconductor material comprises about 0.2 microns of n-type polysilicon, which may be doped during the deposition process or doped subsequently using ion implantation or other doping techniques. After spacer gates 57 are formed, an additional 0.015 microns of gate dielectric (e.g., silicon oxide) is added to the surface of spacer gates 57 and exposed portions of gate oxide 43.

In one embodiment, the etch step that forms spacer gates 57 also exposes protective layer 54 (FIG. 6) and the upper portions of dielectric spacers 59. Protective layer 54 and the upper portions of dielectric spacers 59 are then etched so that protective layer 54 is removed, and upper portions of dielectric spacers 59 are removed between spacer gates 57 and conductive layers 53. This leaves a gap between conductive layers 53 and spacer gates 57.

In a further step, conductive material such as polysilicon is deposited to provide connective conductive portions 77. Connective conductive portions 77 fill the gap formed during the removal of protective layer 54 and portions of dielectric spacers 59, and couple or electrically connect spacer gates 57 to conductive layers 53. An n-type doping step is then done to dope connective conductive portions 77, and to provide dopant for source regions 33. In an exemplary embodiment, an arsenic implant dose of $3.0\times10^{15}$ atoms/cm$^2$ with an implant energy of 80 KeV is used for this doping step.

Figure 8:
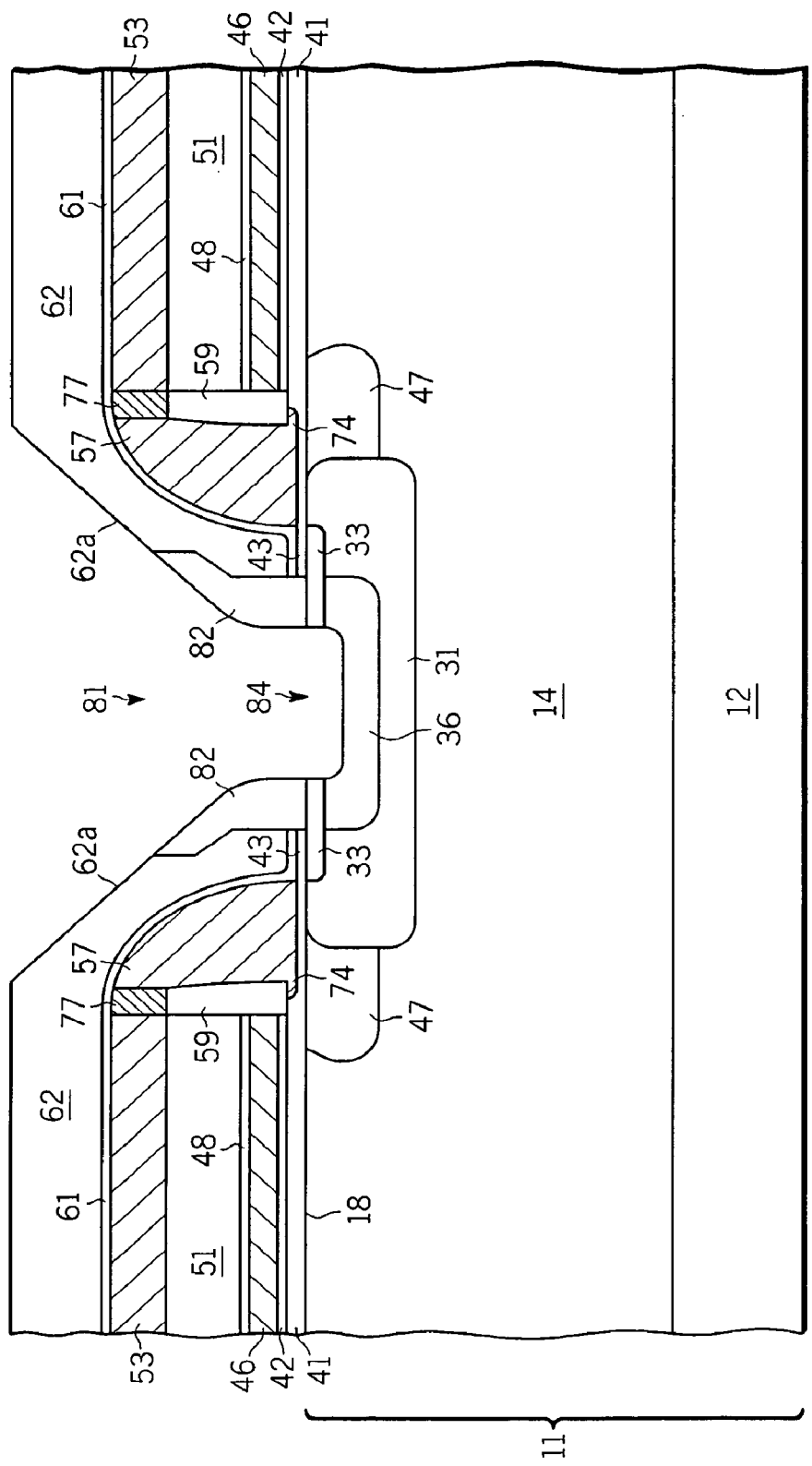
FIG. 8 illustrates a highly enlarged partial cross-sectional view of an embodiment of the present invention at a still further stage of fabrication.

FIG. 8 shows an enlarged partial cross-sectional view of device 10 after further steps in fabrication. Fifth dielectric layer 61 is deposited, and comprises for example, about 0.05 microns of silicon nitride. ILD layer 62 is then deposited over fifth dielectric layer 61. In an exemplary embodiment, ILD layer 62 comprises a deposited silicon oxide about 0.8 microns in thickness. An optional ILD taper etch is used to taper portions 62a of ILD layer 62, which helps with step coverage for subsequently formed layers.

Next, a conventional photolithographic and etch step is used to form contact opening 81, which exposes a portion of major surface 18. Contact region 36 is then formed through opening 81 using a p-type ion implantation step. By way of example, a boron ion implant dose of $3.0\times10^{14}$ atoms/cm$^2$ and an implant energy of 80 KeV is used. A conformal spacer layer is then deposited and etched to form spacers 82. In an exemplary embodiment, a 0.3 micron layer of silicon nitride is deposited and etched to form spacers 82. A rapid anneal step is used at this point to activate and diffuse the various ion implants. For example, device 10 is exposed to a temperature of about 1030 degrees Celsius for about 45 seconds.

An etch step is then used to remove a portion of major surface 18 to form recessed portion 84. This allows source contact layer 63 to contact both source regions 33 and contact region 36, which shorts these regions together. Spacers 82 are then removed. In subsequent processing, source contact layer 63 is deposited and patterned. Substrate 12 is then optionally thinned, and drain contact layer 66 is deposited to provide the structure shown in FIG. 1. It is further understood that other conductive layers such as silicide layers may be formed before depositing source contact layer 63.

In view of all the above, it is evident that a novel device and methods of its manufacture are disclosed. Included, among other features, is a semiconductor device with localized regions of doping near exit portions of the device's channel regions that, among other things enhance $I_{DSAT}$ performance. Additionally, this performance is enhanced without significantly degrading $BV_{DSS}$ or increasing gate to drain or shield to drain capacitances.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A method for forming a semiconductor device, comprising the steps of:
   providing a substrate having a major surface, wherein the substrate comprises a first conductivity type;
   forming a pedestal structure on a portion of the major surface;
   forming a conductive material along a side surface of the pedestal structure to define an edge of a first conduction electrode of the semiconductor device;
   forming a first doped region of a second conductivity type in the major surface adjacent the first conduction electrode, wherein a portion of the first doped region forms a channel region when the semiconductor device is in operation;
   forming second region of the first conductivity type in the first doped region; and
   forming a localized region of doping of the first conductivity in the substrate in proximity to a drain edge of the channel region, wherein the localized region of doping is confined both vertically and horizontally adjacent the major surface, and wherein the localized region of doping has a dopant concentration at least five times greater than a dopant concentration of a portion of the semiconductor material, and wherein the portion of the semiconductor material is adjacent the major surface and adjacent to the localized region of doping.

2. The method of claim 1, wherein the step of forming the localized region of doping includes forming a localized region of doping having a doping concentration about five times to about fifty times greater than that of the substrate.

3. The method of claim 1, wherein the step of forming the localized region of doping includes ion implanting dopant into the substrate.

4. The method of claim 3, wherein the step of ion implanting dopant includes ion implanting with a tilt angle between about 25 degrees and about 60 degrees.

5. The method of claim 1, wherein the step of forming the localized region of doping includes forming the localized region of doping using an edge defined by the side surface of the pedestal structure.

6. A method for forming a semiconductor device, comprising the steps of:
   providing a semiconductor material having a major surface, wherein the semiconductor material comprises a first conductivity type;

forming a body region of a second conductivity type opposite the first conductivity type as part of the semiconductor material, wherein the body region is configured to form a channel region;

forming a source region of the first conductivity type as part of the semiconductor material contiguous with the body region;

forming a control electrode formed in spaced relationship with the semiconductor material; and forming a localized region of doping of the first conductivity type as part of the semiconductor material in proximity to a drain edge of the channel region, wherein the localized region of doping is confined both vertically and horizontally adjacent the major surface, and wherein the localized region of doping has a dopant concentration at least five times greater than a dopant concentration of a portion of the semiconductor material, and wherein the portion of the semiconductor material is adjacent the major surface and adjacent to the localized region of doping.

7. The method of claim 6, wherein the step of forming the localized region of doping includes forming the localized region of doping extending a lateral distance from the body region in a range from about 0.1 microns and about 0.4 microns.

8. The method of claim 6, wherein the step of forming the localized region of doping includes forming the localized region of doping having a dopant concentration about five times to about fifty times greater than that of the semiconductor material.

9. The method of claim 6, wherein the step of providing the semiconductor material includes providing the semiconductor material having a second surface opposite the major surface, and wherein the method further includes the step of forming a conduction electrode associated with the second surface.

10. The method of claim 6, further comprising the step of forming a pedestal structure associated with the major surface and having a side surface, wherein the step of forming the control electrode includes forming a conductive material along the side surface, and wherein the step of forming the localized region of doping includes forming the localized region of doping having an edge defined by the side surface of the pedestal structure.

11. The method of claim 10, wherein the step of forming the pedestal structure includes the steps of:

forming a first dielectric layer associated with the major surface;

forming a second dielectric layer associated with the first dielectric layer; and forming a conductive layer associated with the second dielectric layer and coupled to the control electrode.

12. The method of claim 11, wherein the step of forming the conductive layer includes forming a conductive layer comprised of polycrystalline silicon.

13. The method of claim 6, further comprising the step of forming a shield layer associated with the localized region of doping.

14. The method of claim 13, wherein the step of forming the shield layer including forming a shield layer comprised of polycrystalline silicon.

15. A method of forming a semiconductor device, comprising the steps of:

providing a semiconductor substrate having a first layer of a first conductivity type and a major surface;

forming a body region of a second conductivity type opposite the first conductivity type associated with the first layer, wherein the body region is configured for forming a channel;

forming a source region of the first conductivity type associated with the body region;

forming a gate structure adjacent the channel; and forming a current spreading region in a first portion of the first layer and abutting a drain end of the channel, wherein the current spreading region comprises the first conductivity type, and wherein the current spreading region is localized and confined both vertically and horizontally adjacent the major surface, and wherein the current spreading region has a dopant concentration at least five times greater than that of the first layer, and wherein a second portion of the first layer is adjacent the major surface, and wherein the current spreading region is between the body region and the second portion of the first layer.

16. The method of claim 15, wherein the step of forming the current spreading region includes forming the current spreading region extending laterally from the body region a distance in a range from about 0.1 microns to about 0.4 microns.

17. The method of claim 15 further comprising the step of forming a pedestal structure in association with the major surface, and wherein the step of forming the gate structure includes forming a control electrode associated with a side surface of the pedestal structure.

18. The method of claim 17 wherein the step of forming the control electrode includes forming the control electrode further overlying the pedestal structure.

19. The method of claim 17, wherein the step of forming the pedestal structure includes forming a pedestal structure having a shield layer.

20. The method of claim 15, wherein the step of forming the current spreading region includes forming a current spreading region having a peak doping concentration in range from about $5.0 \times 10^{16}$ atoms/cm$^3$ to about $1.0 \times 10^{17}$ atoms/cm$^3$.

* * * * *